United States Patent
Meyer, IV et al.

(10) Patent No.: US 7,599,185 B2
(45) Date of Patent: Oct. 6, 2009

(54) COOLING DEVICE

(75) Inventors: George Anthony Meyer, IV, San Jose, CA (US); Chien-Hung Sun, Zhongli (TW); Ming-Kuei Hsieh, Zhongli (TW)

(73) Assignee: Celsia Technologies Taiwan, Inc., Taoyuan (TW)

( * ) Notice: Subject to any disclaimer, the term of this patent is extended or adjusted under 35 U.S.C. 154(b) by 0 days.

(21) Appl. No.: 12/170,556

(22) Filed: Jul. 10, 2008

(65) Prior Publication Data
US 2009/0195984 A1    Aug. 6, 2009

(30) Foreign Application Priority Data
Feb. 4, 2008    (TW) .............................. 97202370 U

(51) Int. Cl.
*H05K 7/20*    (2006.01)
*H01L 23/36*    (2006.01)
(52) U.S. Cl. ................. 361/700; 361/701; 165/104.21; 165/104.26; 165/104.33
(58) Field of Classification Search ......... 361/689–691, 361/698–701, 702–712, 715, 719, 722; 165/80.2, 165/80.3, 80.4, 104.21, 104.23, 104.26, 104.27, 165/104.28, 104.32, 104.33, 170, 171; 257/E23.098, 257/E23.087, E23.107, 706–727; 174/15.1, 174/15.2, 16.3, 252; 29/890.032
See application file for complete search history.

(56) References Cited

U.S. PATENT DOCUMENTS

| | | | | | |
|---|---|---|---|---|---|
| 5,508,884 | A | * | 4/1996 | Brunet et al. | 361/698 |
| 5,694,295 | A | * | 12/1997 | Mochizuki et al. | 361/699 |
| 6,490,160 | B2 | * | 12/2002 | Dibene et al. | 361/700 |
| 6,650,544 | B1 | * | 11/2003 | Lai | 361/700 |
| 6,874,568 | B2 | * | 4/2005 | Lai | 165/104.26 |
| 6,918,431 | B2 | * | 7/2005 | Reyzin et al. | 165/104.21 |
| 7,342,306 | B2 | * | 3/2008 | Colbert et al. | 257/712 |
| 7,435,622 | B2 | * | 10/2008 | Colbert et al. | 438/118 |
| 2006/0039111 | A1 | * | 2/2006 | Huang | 361/698 |
| 2006/0118280 | A1 | * | 6/2006 | Liu | 165/104.33 |
| 2008/0266800 | A1 | * | 10/2008 | Lankston et al. | 361/700 |
| 2009/0151906 | A1 | * | 6/2009 | Lai et al. | 165/104.26 |

* cited by examiner

*Primary Examiner*—Michael V Datskovskiy
(74) *Attorney, Agent, or Firm*—Chun-Ming Shih

(57) ABSTRACT

A cooling device for dissipating heat generated by an electronic element includes a fixing seat, a cooling body, and a vapor chamber. The fixing seat is arranged an opening. The cooling body includes a bottom plate attached onto the fixing seat and a plurality of cooling fins that are interspaced to each other and are attached to the bottom plate, in which a fixing hole is arranged at one side of the bottom plate, and an accommodating space is configured at the cooling fins in corresponding to the fixing hole. The vapor chamber is accommodated in the opening of the fixing seat, and one side of the vapor chamber contacts a bottom part of the cooling body, while another side contacts the electronic element.

6 Claims, 4 Drawing Sheets

COOLING DEVICE

BACKGROUND OF THE INVENTION

1. Field of the Invention

The present invention generally relates to a cooling device, in particular, to a cooling device for an electronic element.

2. Description of Prior Art

When an electronic product is under an operating or working status, the element's interior will generate heat. If this heat is not removed in time, the function of the electronic element will be deteriorated, or a burning will be perhaps occurred, making the product completely out of use.

In a cooling device according to the prior art, a cooling body made of aluminum directly contacts the surface of the electronic element, making the heat generated from the electronic element conducted to the surface of the cooling body, where the heat is carried away by an air flow, thus a cooling effect being able to be achieved.

However, in today's electronic element used by any electronic product, following a significant increase of operational and computational speeds, the generated heat is also very significant subsequently, making the cooling performance of the aforementioned cooling device unable to satisfy the current need.

Therefore, a cooling device of another prior art is developed, in which a metallic block with an excellent heat conductibility is used, for example, a copper block. In this invention, one face of the metallic block contacts the surface of the electronic element, while another face contacts a cooling body made of aluminum. During operation, the heat generated from the electronic element is transferred to the cooling body via the metallic block to achieve a higher cooling performance.

However, the performance is still limited by this kind of conducting mechanism to achieve a cooling effect. Therefore, another cooling device of prior art is developed subsequently, in which a plurality of heat pipes each shown as "U" shape are arranged through a cooling body made of aluminum. The bottom part of the heat pipe inter-contacts the electronic element, making the waste heat generated from the electronic element transferred to the cooling body by means of a phase change of a working fluid stored in the heat pipe. Thereby, a higher cooling performance may be obtained.

But, according to above invention, the contacting way between the heat pipe and the electronic element is just a line contact. If a plurality of heat pipes that are interspaced to each other are applied, the contacting manner between the heat pipes and the electronic element will be more close to a surface contact, by which a better cooling performance will be made. However, in the meantime, the manufacturing cost of this kind of cooling device is also notably high.

Accordingly, aiming to solving the aforementioned shortcomings, after a substantially devoted study, in cooperation with the application of relatively academic principles, the inventor has at last proposed the present invention "Cooling Device" that is designed reasonably to possess the capability to improve the prior arts significantly.

SUMMARY OF THE INVENTION

The invention is mainly to provide a cooling device for cooling an electronic element. In the invention, a surface contact existing between a vapor chamber and an electronic element rapidly transfers the heat generated from the electronic element to a cooling body, such that it is possible to significantly enhance the cooling performance of this kind of cooling module.

Secondly, the invention is to provide a cooling device for cooling an electronic element includes a fixing seat, a cooling body, and a vapor chamber. In the invention, the fixing seat is arranged an opening; the cooling body includes a bottom plate attached onto the fixing seat and a plurality of cooling fins that are interspaced to each other and are attached to the bottom plate, in which a fixing hole is arranged at one side of the bottom plate, and an accommodating space is configured at the cooling fins in corresponding to the fixing hole; the vapor chamber is accommodated in the opening of the fixing seat, and one side of the vapor chamber contacts a bottom part of the cooling body, while another side contacts the electronic element.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the invention are described thereinafter according to a preferable embodiment, being not used to limit its executing scope. Any equivalent variation and modification made according to appended claims is all covered by the claims claimed by the present invention.

Figure 1:
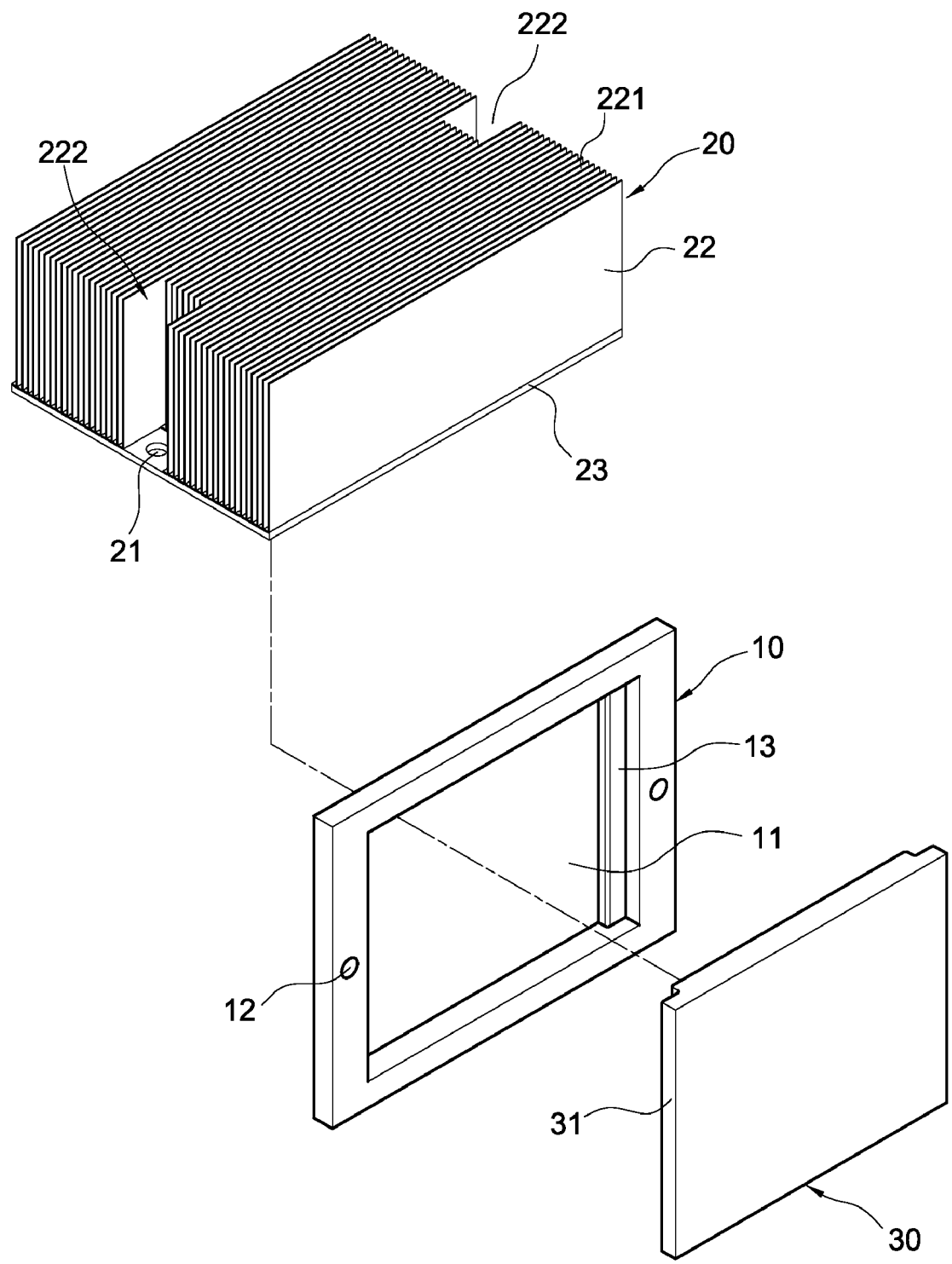
FIG. 1 is an explosively perspective view of the invention.
Figure 2:
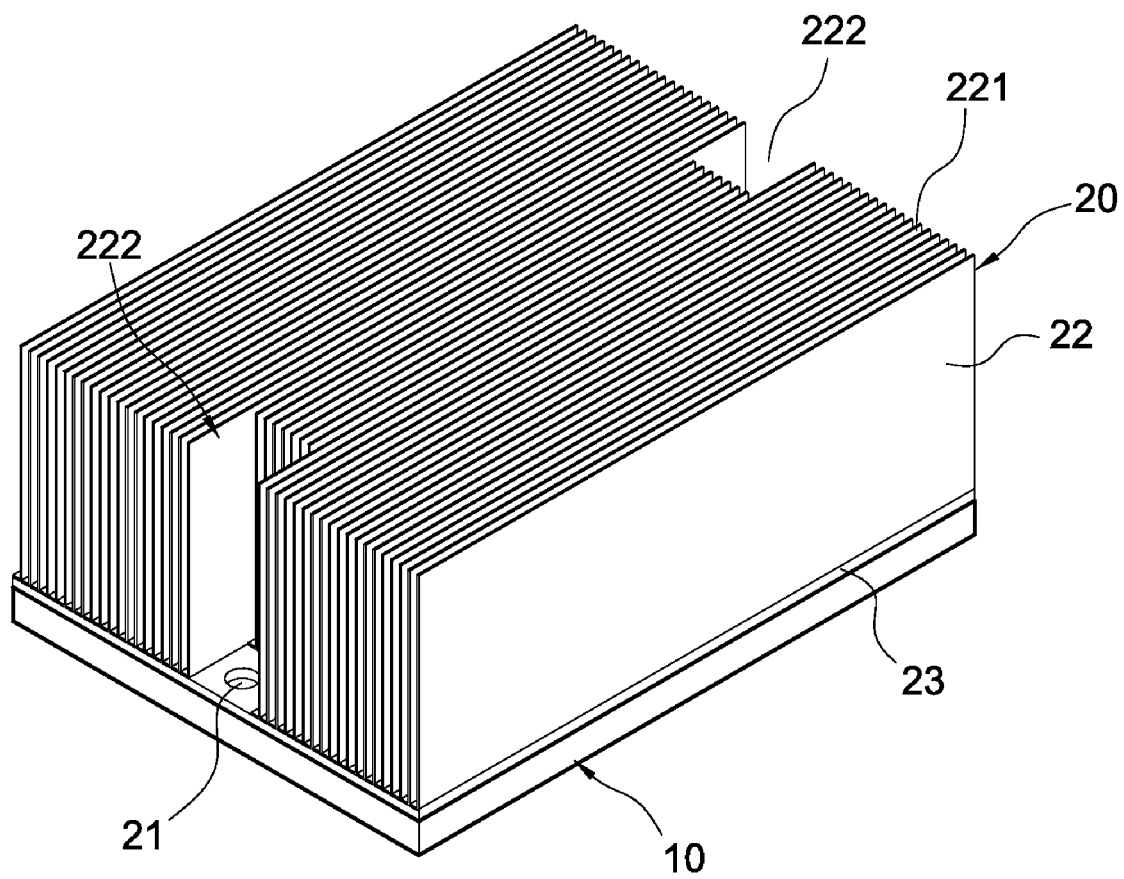
FIG. 2 is a perspective assembled view of the invention.

Please refer to FIG. 1 and FIG. 2, which respectively are an explosively perspective view and a perspective assembled view of a preferable embodiment according to the present invention. The invention is mainly to provide a cooling module for cooling an electronic element, and the cooling module includes: a fixing seat 10, a cooling body 20, and a vapor chamber 30.

In this case, an opening 11 is arranged in the fixing seat 10, two sides of which are respectively arranged a perforation 12. The fixing seat 10 is made of metallic materials, possessing excellent heat conduction, for example, Aluminum copper and silver. The cooling body 20 made of a conductive material such as aluminum or copper is attached onto the fixing seat 10.

The cooling body 20 includes a bottom plate 23, two sides of which are arranged two fixing holes 21, and a plurality of cooling fins 22, which are interspaced to each other and are attached to the bottom plate 23, and between each two of which a cooling passage 221 is formed. In addition, two accommodating spaces 222 are configured at the cooling fins 22 in corresponding to the two fixing holes 21.

The vapor chamber 30 is accommodated in the opening 11 and connected to the fixing seat 10. One side of the vapor chamber 30 contacts a bottom part of the cooling body 20, while another side contacts the electronic element (not shown in the figures). In addition, a stopping block 13 is formed on an inner wall of the opening 11 of the fixing seat 10. On the other hand, a flange 31 corresponded to the stopping block 13 is formed at an outer side of the vapor chamber 30. The stopping block 13 and the flange 31 are engaged together to secure the vapor chamber 30 to the fixing seat 10.

The vapor chamber is a vacuum chamber, an inner wall of which has a microscopic structure. When a heat is transferred to an evaporating zone from a heat source, a working fluid stored in the chamber will generate a phase-changing phenomenon, in which a liquid phase will be changed into a vapor phase. At this time, the volume of the working fluid will be expanded rapidly due to the heat absorption, making the entire chamber filled with the vaporized working fluid. When the vaporized working fluid contacts a cooler zone, a condensation will be occurred. The heat absorbed in the evaporating zone will be released via this condensing phenomenon. After being condensed, the working fluid will flow back to the original evaporating zone by means of a capillary mechanism created by the capillary structure arranged in the vapor chamber. Aforementioned operation will be repeated continuously in the chamber. Basically, the working principle of a vapor chamber is same as that of a heat pipe. The only difference is that a heat pipe undergoes a "line" heat transfer in one-dimensional manner, and a vapor chamber undergoes a "surface" heat transfer in two-dimensional manner.

Figure 3:
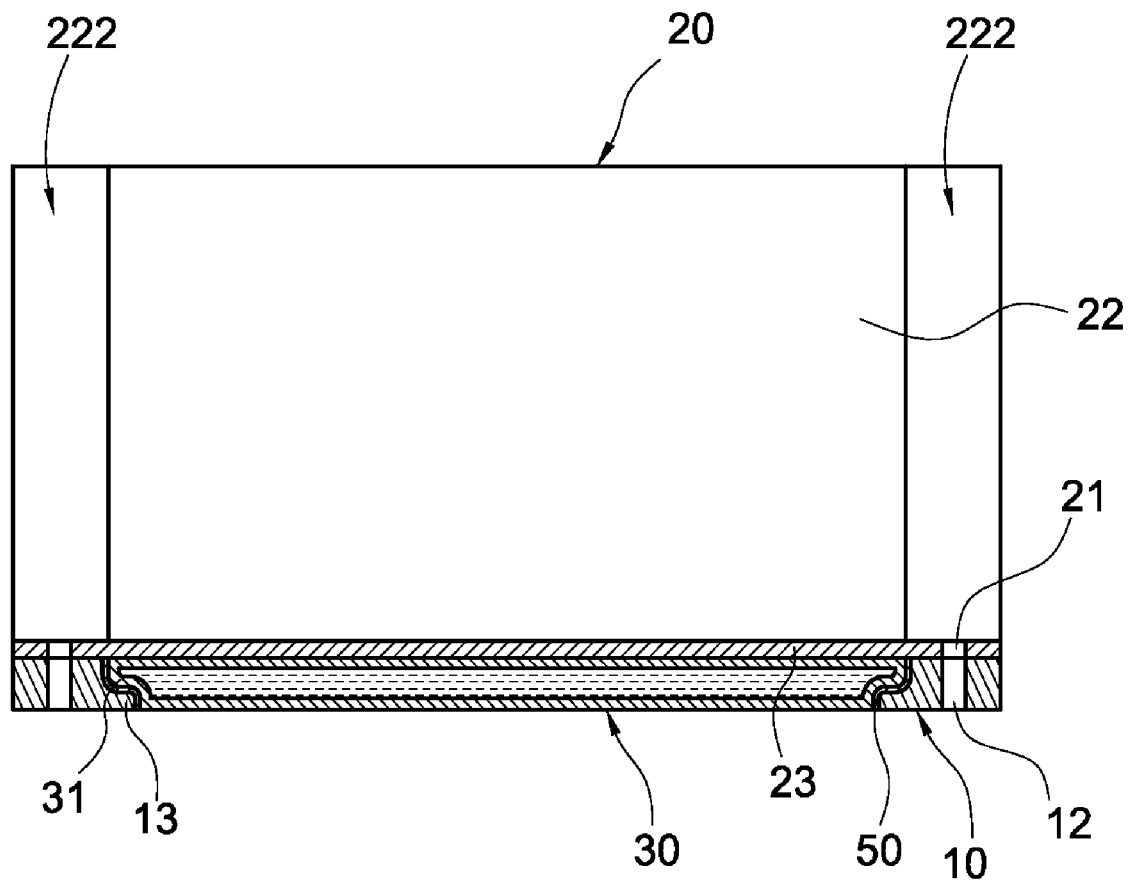
FIG. 3 is a cross-sectional view of the invention.
Figure 4:
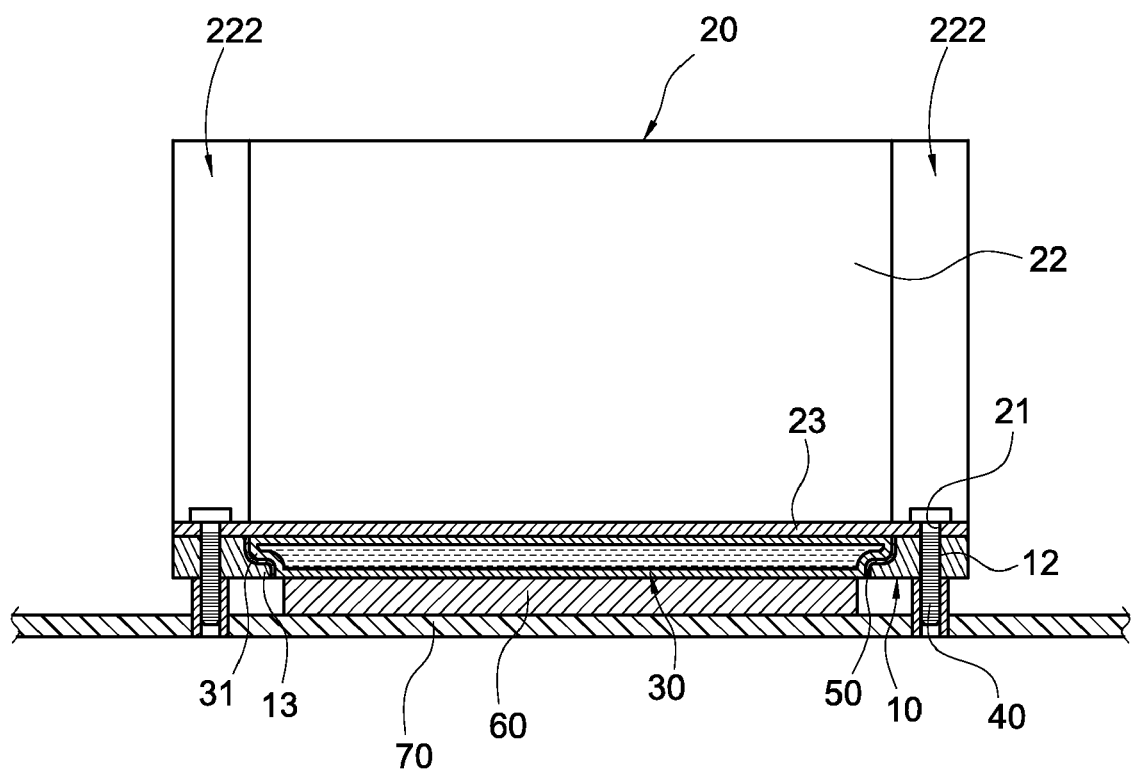
FIG. 4 is a cross-sectional view of a preferable embodiment of the invention.

Please refer to FIG. 3 and FIG. 4 together. These two figures are respectively a cross-sectional view of the invention and a cross-sectional view of a preferable embodiment of the invention. In this case, a heat-conducting media 50 is uniformly coated on a contacting surface between the fixing seat 10 and the vapor chamber 30 and the cooling body 20. The function of this heat-conducting media 50 is to accelerate the speed of heat transfer and to transfer the heat absorbed by the vapor chamber to the fixing seat 10, making the waste generated from the electronic element unable to be stored in the vapor chamber 30.

In this case, a fixing element 40 is applied for securing the cooling module to a circuit board 70, by passing the fixing element 40 to be secured to a circuit board 70 through the perforation 12 and the fixing hole 21. The fixing element 40, for example, is a bolt.

A bottom face of the vapor chamber 30 inter-contacts the electronic element 60, and the size of the vapor chamber 30 matches that of the electronic element 60 in a way, such that a face of the vapor chamber 30 can completely contact a face of the electronic element 60 to thereby achieve an optimally cooling performance.

Therefore, a cooling module according to the invention has following merits:

1. A surface contact formed between the vapor chamber 30 and the electronic element 60 can rapidly remove the waste heat generated from the circuit board 70 and the electronic element 60 in a way, such that an optimally cooling performance is achieved.

2. A heat-conducting media can further enhance the heat-transferring performance by rapidly transferring the heat of the vapor chamber to the fixing seat 10 and the cooling body 20, making the waste heat unable to be accumulated in the vapor chamber 30.

3. In the cooling module, a vapor chamber 30 is combined to a cooling body 20, so it is possible to significantly save the manufacturing cost of the cooling module and notably promote the cooling performance as well.

Summarizing aforementioned description, the invention is a novel structure of a cooling device indeed, which may positively reach the expected usage objective for solving the drawbacks of the prior arts, and which extremely possesses the innovation and progressiveness to completely fulfill the applying merits of new type patent, according to which the invention is thereby applied. Please examine the application carefully and grant it as a formal patent for protecting the rights of the inventor.

Moreover, the aforementioned description is only a preferable embodiment according to the present invention, being not used to limit the patent scope of the invention, so equivalently structural variation made to the contents of the present invention, for example, description and drawings, is all covered by the claims claimed thereinafter.

What is claimed is:

1. A cooling device for dissipating heat generated by an electronic element, including:
    a fixing seat having an opening;
    a cooling body, which includes a bottom plate and a plurality of cooling fins that are interspaced to each other and are attached to the bottom plate, the bottom plate being attached onto the fixing seat, at least at one side of the bottom plate being arranged a fixing hole, an accommodating space being arranged at the cooling fins in corresponding to the fixing hole; and
    a vapor chamber, which is accommodated in the opening and connected to the fixing seat, wherein one side of the vapor chamber contacts a bottom part of the cooling body, while another side contacts the electronic element.

2. The cooling device according to claim 1, further including a heat-conducting media, which is uniformly coated on a contacting surface between the vapor chamber and the fixing seat and the cooling body.

3. The cooling device according to claim 1, wherein a cooling passage is formed between any two cooling fins.

4. The cooling device according to claim 3, wherein a perforation is arranged at the fixing seat in corresponding to the fixing hole, and wherein the perforation and the fixing hole are for a fixing element to pass through to secure the cooling body to the fixing seat.

5. The cooling device according to claim 4, wherein the fixing element is a bolt.

6. The cooling device according to claim 1, wherein a stopping block is formed at an inner wall of the opening of the fixing seat, and wherein a flange corresponded to the stopping block is formed at an outer side of the vapor chamber to be engaged with the stopping block.

* * * * *